United States Patent
Kasai

(10) Patent No.: US 6,443,737 B2
(45) Date of Patent: Sep. 3, 2002

(54) CIRCUIT BOARD, ELECTRICAL CONNECTION BOX HAVING THE CIRCUIT BOARD AND METHOD OF MAKING THE CIRCUIT BOARD

(75) Inventor: Koji Kasai, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/758,389

(22) Filed: Jan. 12, 2001

(30) Foreign Application Priority Data

Jan. 19, 2000 (JP) .................................... 2000-010732

(51) Int. Cl.[7] .............................................. H01R 29/00
(52) U.S. Cl. ...................................................... 439/44
(58) Field of Search ............................ 439/65, 44, 49; 361/805, 732, 739

(56) References Cited

U.S. PATENT DOCUMENTS

| | | | | |
|---|---|---|---|---|
| 2,019,625 A | * | 11/1935 | O'Brien | 439/65 |
| 3,290,557 A | * | 12/1966 | Ayer | 439/65 |
| 3,405,384 A | * | 10/1968 | Finch | 439/736 |
| 4,801,765 A | * | 1/1989 | Moyer et al. | 439/736 |
| 4,859,806 A | * | 8/1989 | Smith | 439/46 |

FOREIGN PATENT DOCUMENTS

JP 56-130989 10/1981

* cited by examiner

Primary Examiner—Brian Sircus
Assistant Examiner—Phuong K T Dinh
(74) Attorney, Agent, or Firm—Oliff & Berridge, PLC

(57) ABSTRACT

A circuit board has an insulation board and strip bus bars arranged on the opposite faces of the board. On one face, the bus bars extend in parallel in a first direction. On the second face, the bus bars extend in parallel in a second direction crossing the bars extending in said first direction, so that there is an array of crossing points of the bus bars. The insulation board has holes at which the mutually crossing bus bars are bent towards each other and joined to establish electrical connection. In this way, a predetermined wiring pattern is obtained, which can be varied easily.

18 Claims, 7 Drawing Sheets

CIRCUIT BOARD, ELECTRICAL CONNECTION BOX HAVING THE CIRCUIT BOARD AND METHOD OF MAKING THE CIRCUIT BOARD

BACKGROUND OF THE INVENTION

1. Field of Invention

This invention relates to a circuit board and to an electrical connection box containing such a circuit board, e.g. an electrical connection box for use in an automobile or other vehicle. The invention also relates to a method of making such a circuit board.

2. Description of Related Art

To form a circuit board constituting the interior circuit of an electrical connection box, e.g. a junction box for an automobile and the like, there has conventionally been used a pressure welding system of wiring a wire, such as a single core wire or the like, along a circuit on an insulation board and connecting a pressure welding terminal on said wire by pressure welding. It is also known to use bus bars formed by stamping an electro-conductive metal plate into a circuit board shape.

When a pressure welding system is used for the formation of an interior circuit, circuits accommodated in an electrical connection box have recently increased in accordance with a large increase of electric parts to be connected. Since the shape of an insulation board where an electric wire is wired in the pressure welding system becomes complicated, problems occur such that the wiring work and the processing of an insulation board require a long time, resulting in increased production costs.

Further, when bus bars are used as an interior circuit, a mold for stamping must be made in accordance with the circuit. As a result, the alteration of a circuit cannot be easily carried out and the costs of preparation of a mold are high. Further, because a lot of residual parts are not used after stamping, the yield of the electro-conductive metal plate is poor, which also raises costs. For example, if seven or eight sheets of bus bars were arranged in multi-layer lamination with insulation boards between them, the cost is high, because of a sharp increase of the number of circuits accommodated in the inside of an electrical connection box.

A circuit board 2 for the interior of an electric connection box, shown in present FIGS. 7(A) and 7(B), is proposed in JP-A-56-130989, in view of the above problems. Insulation sheets 1a, 1b are laminated on both sides of an electro-conductive member 3, which is made in a lattice shape by stamping out the removed parts 3a of an electro-conductive metal plate. The circuit is formed by cutting the unwanted connection points 3b. Wiring is connected to the electro-conductive member 3 to make connection with exterior circuits. Since the circuit is formed by cutting the points 3b, variation of the circuit is easily achieved. However, since the lattice-shape is formed by stamping and there are a lot of the removed parts 3a, there remains the problem that the yield of the electro-conductive metal plate is not improved.

SUMMARY OF THE INVENTION

The present invention has as a first object to reduce the cost related to forming the interior circuit. Another object is to permit easy variation of a circuit. A third object is to design a cost reduction by easily forming insulation materials which lie between the third bus bars.

In a first aspect of the invention, a circuit board is provided having an insulation board with first and second opposite main faces. A plurality of first strip bus bars are arranged on the first main face. The first strip bus bars extend in parallel in a first direction. A plurality of second strip bus bars are arranged on the second main face. The second strip bus bars extend in parallel in a second direction crossing the first strip bus bar extending in the first direction, whereby, as seen in plan view, on one of the main faces there is an array of crossing points of the first and second bus bars. The insulation board has a plurality of holes through it at a plurality of the crossing points. The mutually crossing bus bars are bent each towards each other at the holes and mutually joined through the board to establish electrical connection between them, whereby a predetermined wiring pattern is obtained.

Preferably, at the holes the bus bars are joined by welding, but other joining methods are possible. Resistance welding is most preferred.

Preferably the first bus bars are located in grooves in the first main face of the insulation board, and the second bus bars are located in grooves in the second main face.

Suitably at the holes, the thickness of each of the mutually crossing bus bars in the direction of the insulation board is reduced, compared with the thickness of adjacent portions, by 15 to 25%. In the manufacture of the circuit board, this thickness reduction is accompanied by elongating the bus bar via stretching, to provide the bent portion. This can avoid disturbance of the ends of the bus bars.

A second aspect of the invention provides a method of making a circuit board, comprising the steps of:
 (i) providing an insulation board having first and second opposite main faces and a plurality of holes at locations through which electrical connection is made through the board;
 (ii) locating a plurality of first bus bars on the first main face extending in parallel in a first direction;
 (iii) locating a plurality of second bus bars on the second main face extending in parallel in a second direction crossing the first direction, whereby as seen in plan view on one of the main faces there is an array of crossing points of the bus bars, a plurality of said crossing points coinciding with said holes;
 (iv) providing each of the mutually crossing pair of the bus bars at the position of each of the holes with a portion bent towards the other bus bar of the pair;
 (v) joining the mutually crossing pair of bus bars at said holes to establish electrical connection between them.

In this method, step (iv) is preferably performed to provide the bent portions at the appropriate positions, before locating the bus bars on the insulation board. Preferably, during step (iv), at least one of said first bus bars and said second bus bars are joined at opposite ends thereof to a pair of carrier members which maintain their relative positions.

Prior to the joining step (v), one of the bent portions may have a protrusion directed towards the other of said mutually crossing pair of bus bars.

Within the invention the use of material of the bus bars can be efficient, so that the yield of the material can be improved. Further, stamping by a mold which has been specifically designed for the individual circuit required is unnecessary. Therefore the cost for formation of the circuit board can be greatly reduced.

The bus bars respectively arranged in parallel in the two directions, which are typically orthogonal, may have a nominal thickness, in the direction of the insulation board, in the range of 0.5 mm to 1.0 mm. Both ends thereof may be linked with carriers, and the carriers are cut to be removed after the bent parts are joined, e.g. resistance-welded.

After the bus bars of the two directions are assembled on the insulation board, portions of them which are unnecessary in the circuit may be cut, after joining of the upper and lower bent parts, to form the requisite circuit. It is possible to use standard sets of the bus bars for both of the two directions, to simplify and reduce cost.

Further, the pitches (spacing) of the strip bus bars can be selected to correspond with the spacings of terminals of exterior components, such as a connector, a fuse and a relay. For example, some of the bus bars arranged in parallel in one direction may correspond with the terminal pitch of a fuse, while others may correspond with the terminal pitch of a relay. Some of the bus bars arranged in the second direction may correspond with the small pitch of a connector terminal hole, while others may correspond with a middle-size pitch, and the remainder may correspond with a large pitch.

Thus, tabs connected with these bus bars can be directly connected with the connector, the fuse and the relay, etc.

Further, the present invention provides an electric connection box including the above circuit board. The circuit board of the above-described construction may be arranged as a single layer in the electric connection box, or a plural number of circuit boards may be further arranged by lamination through insulation boards.

BRIEF DESCRIPTION OF THE DRAWINGS

Embodiments of the invention will now be described by way of non-limiting examples with reference to the accompanying drawings, in which.

DETAILED DESCRIPTION OF PREFERRED EMBODIMENTS

Figure 1A:
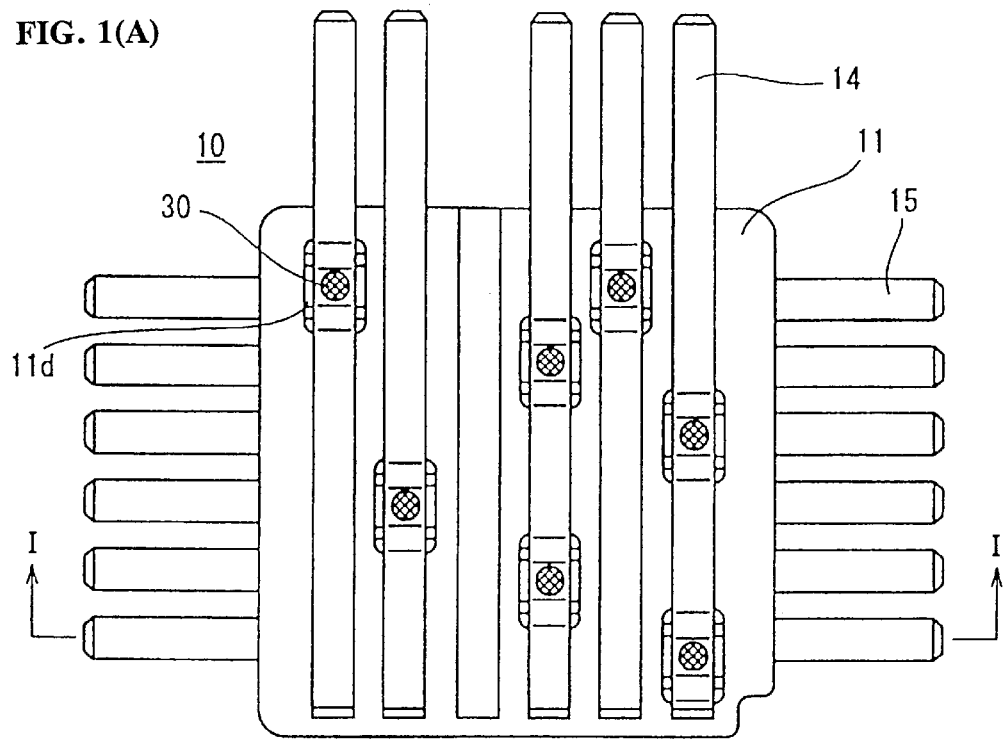
FIG. 1(A) is a plan view of a circuit board which is a first embodiment of the present invention.
Figure 1B:
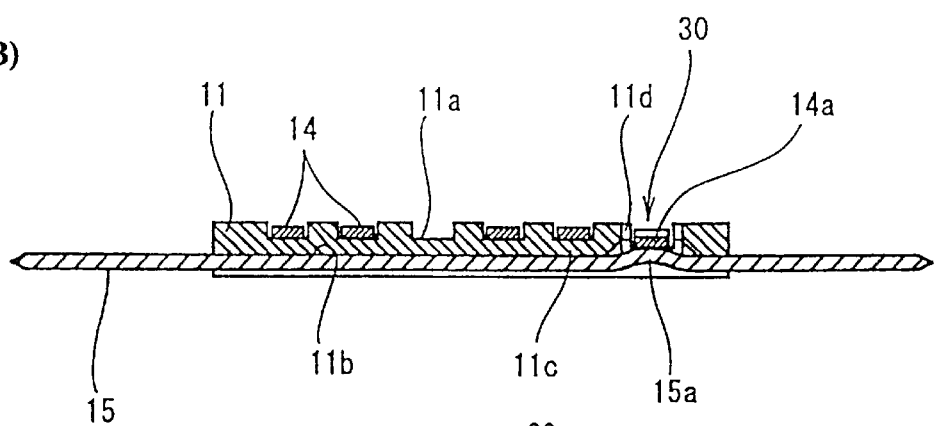
FIG. 1(B) is a sectional view on line I—I of FIG. 1(A)
Figure 1C:
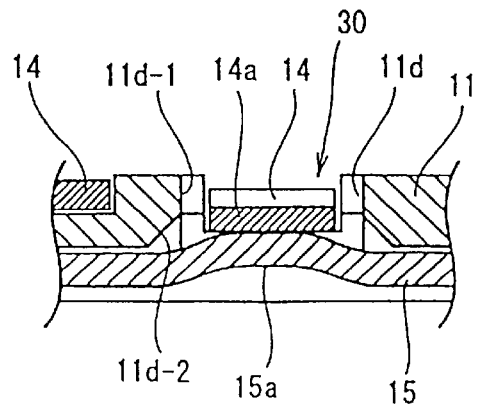
FIG. 1(C) is an enlarged sectional view of a portion of FIG. 1(B)

One embodiment of the present invention is shown in FIGS. 1 to 5 which illustrate the circuit board 10. Strip bus bars 14 are provided as parallel discrete spaced metal strips extending in an X direction on the upper face of an insulation board 11. Strip bus bars 15 are similarly provided as parallel discrete spaced metal strips extending in a Y direction, orthogonal to the X direction, on the lower face of the insulation board 11 at regular spacings. The strip bus bars 14, 15 of the X and Y directions are thus arranged crosswise through the insulation board 11 so as to form a lattice with mutual crossing points of the bus bars. As FIG. 1(B) shows, the bus bars 14, 15 are located in recesses or grooves 11a, 11b in the upper and lower faces of the insulation board 11.

Figure 2A:
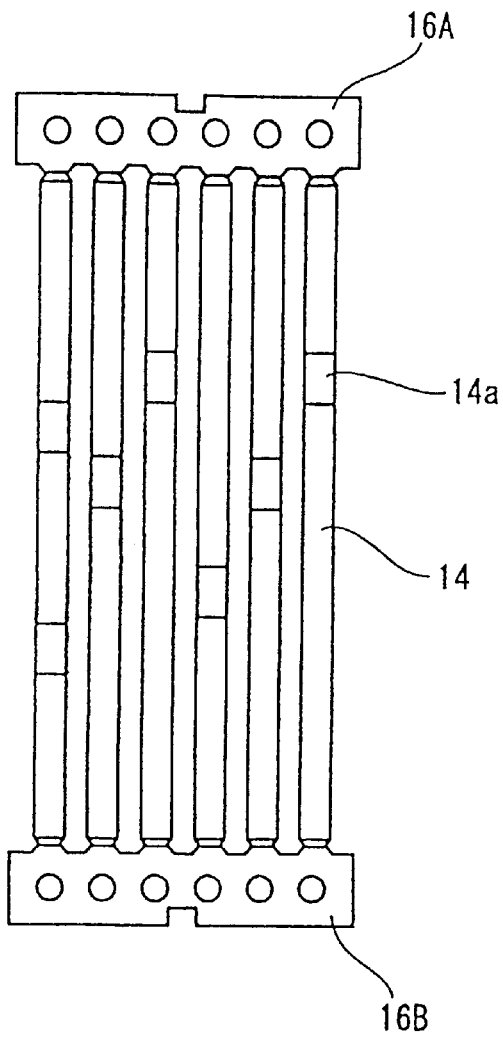
FIG. 2(A) is a plan view of the bus bars of the X direction in the circuit board of FIG. 1(A)

As shown in FIG. 2(A), the ends of the bus bars 14 of the X direction are initially linked with the carriers 16A, 16B, and may be arranged on the upper face of the insulation board 11 in this condition. However, as indicated by FIG. 1(A) in this embodiment, the carrier 16B is cut off after the formation of the bent parts 14a described below and before the bus bars 14 are placed on the board 11. The width of the bus bars 14 is, for example, 2 mm, and their nominal thickness is, for example, 0.64 mm. The spacings (pitches) of the parallel bus bars 14 of the X direction may, as desired, be varied. For example, some may have a pitch of 4 mm, others a pitch of 10 mm and yet others a pitch of 6.8 mm, corresponding with the spacing of terminals of a connector, a fuse and a relay.

Figure 2B:
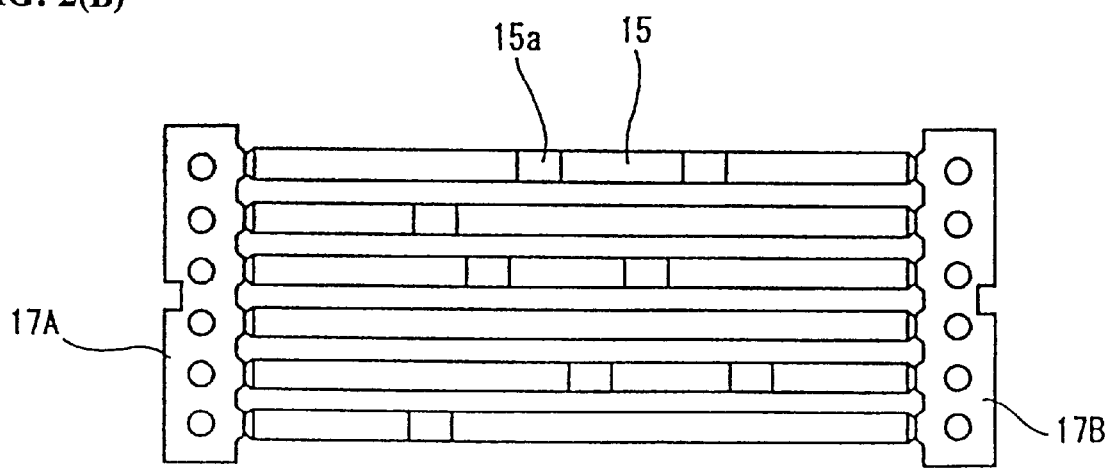
FIG. 2(B) is a plan view of the bus bars of the Y direction.

As shown in FIG. 2(B), the bus bars 15 of the Y direction are similar. Both ends in their longitudinal direction when formed are linked with the carriers 17A, 17B. The bus bars 15 are arranged on the lower face of the insulation board 10 in this condition. The bus bars 15 have a width of, for example, 2 mm, a nominal thickness of, for example, 0.64 mm and a uniform pitch of, for example, 4 mm.

Downwardly bent parts 14a formed by press molding are provided at requisite points on the bus bars 14. Similarly, upwardly bent parts 15a formed by press molding are provided on the bus bars 15. These bent parts 14a, 15a are provided at the positions where the bus bars of the X and Y directions cross and where conductive connection is to be made.

Since there are grooves 11a and 11b on the insulation board 11, the board thickness of the parts 11c between the respective bottom faces of the grooves 11a and 11b are as thin as, for example, 0.8 mm at the cross positions. At the crossing points where the upper and lower bus bars are to be connected penetration holes 11d are provided.

Figure 3A:
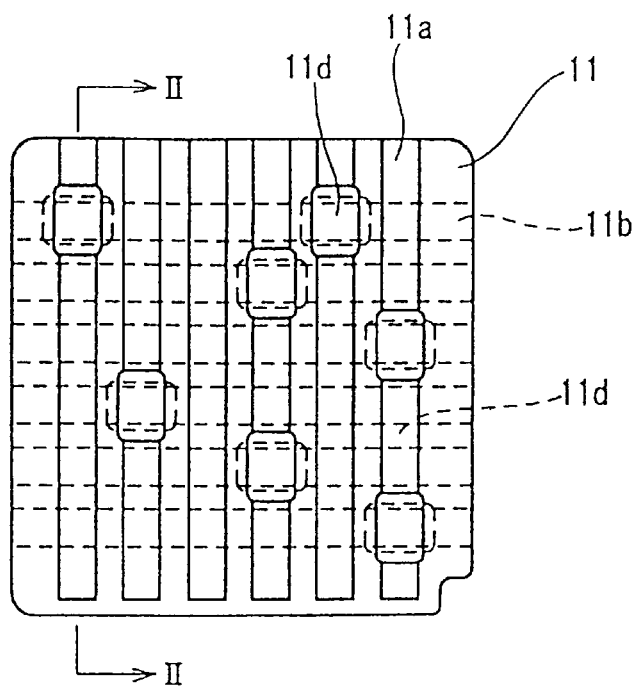
FIG. 3(A) is a plan view of the insulation board of the circuit board of FIG. 1(A)
Figure 3B:
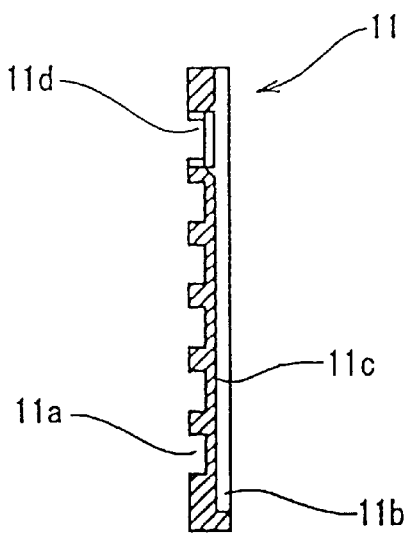
FIG. 3(B) is a sectional view on line II—II of FIG. 3(A)
Figure 3C:
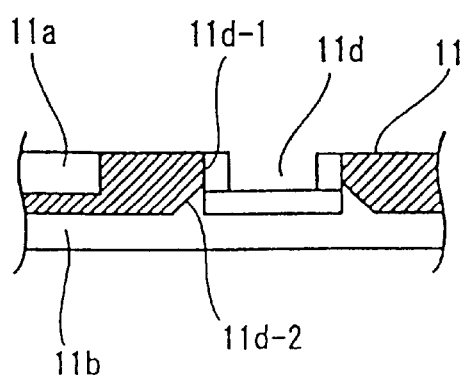
FIG. 3(C) is an enlarged sectional view of a portion of FIG. 3(B)

As shown in FIGS. 3(A)–(C), the penetration holes 11d provide a clearance since their upper parts 11d-1 are larger than the width of bus bars, and their lower parts 11d-2 are enlarged in a taper manner.

The amount of protrusion of the bent parts 14a, 15a of the upper and lower bus bars 14, 15, which are resistance-welded through the penetration holes 11d, is thus fixed, for example, at half (0.4 mm) of the board thickness of 0.8 mm. The protruding faces are mutually brought in contact. To achieve this, the parts 14a, 15a are bent in an approximately arc shape so as to protrude by 0.4 mm by press working. The bus bars 14, 15 are extended in length by this press working so as to be reduced in thickness by, for example, 15 to 25% (20% in the present embodiment) of their nominal thickness. The bent parts 14a, 15a are made so that the dimension between the two ends of each bus bar before formation and after formation of the bent part may be the same.

The bent parts 14b are formed by press working when both ends of the bus bars 14 of the X direction are linked to the carriers 16A, 16B. Even if the number of the bent parts 14b are different in each bus bar 14, the deviation in the end positions of the respective bus bars 14 does not occur, and distortion and cracking do not occur in the carriers 16A, 16B. The same applies for the bus bars 15 of the Y direction and the carriers 17A, 17B.

Figure 4:
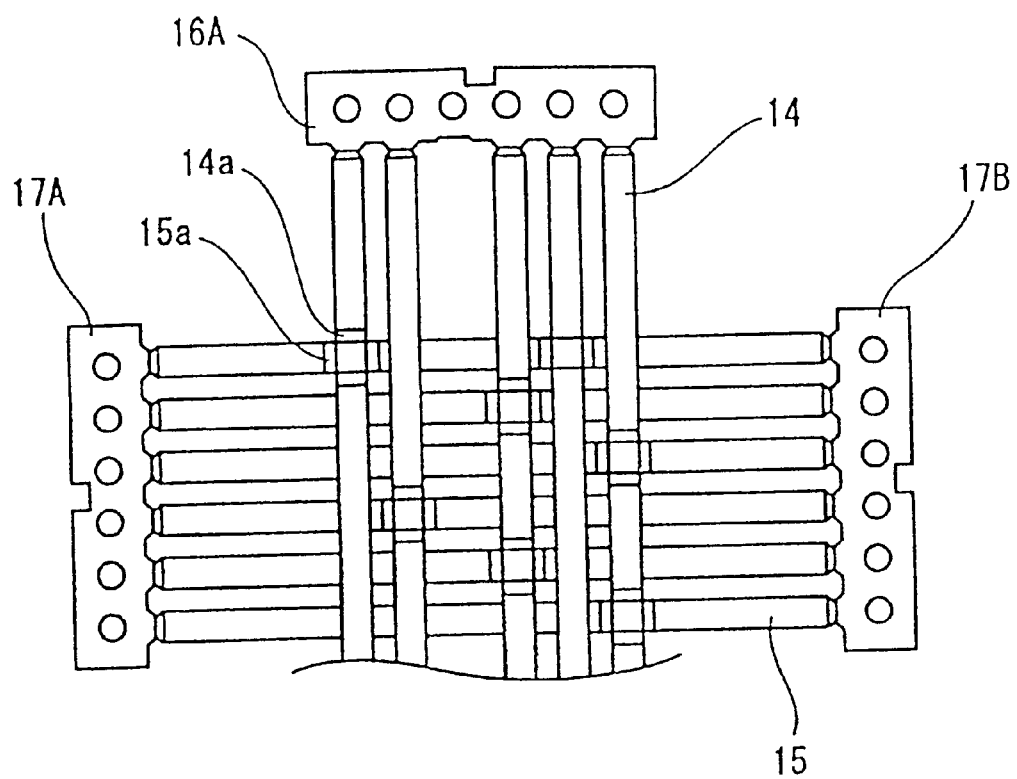
FIG. 4 is a plan view showing the assembled state of the bus bars of the X direction and the Y direction, in the circuit board of FIG. 1(A)

As shown in FIG. 4, the bus bars 14 can be arranged on the upper face of the insulation board 11 when linked with the carriers 16A, 16B, and the bus bars 15 can be arranged on the lower face of the insulation board 11 when linked with the carriers 17A, 17B. Then the bent parts 14a of the bus bars 14 protrude downwards in the penetration holes 11d, and the bent parts 15a of the bus bars 15 protrude upwards to bring the faces of the upper and lower bent parts 14a and 15a, respectively, in contact.

Figure 5:
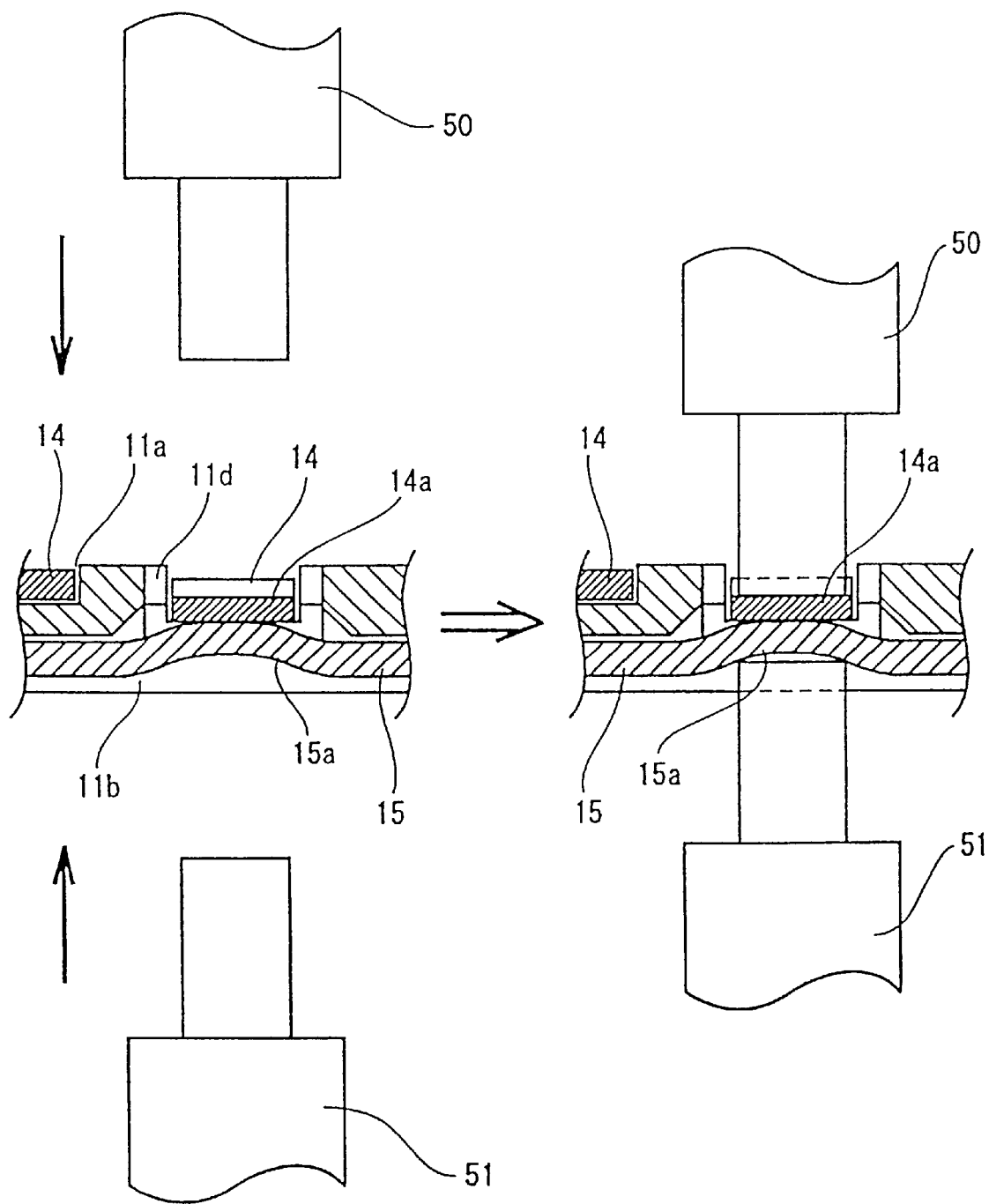
FIG. 5 is a sectional view showing the resistance welding of the bus bars of the X and Y directions, in the circuit board of FIG. 1(A)

As shown in FIG. 5, the resistance welding is carried out by pressing the electrodes 50, 51 of a resistance welder on the bent parts 14a, 15a from above and below, respectively, so that resistance welds 30 (see FIG. 1) are formed between the bus bars 14, 15. After resistance-welding of the bent parts 14a, 15a, the carriers 16A and 16B of the bus bars 14 and the carriers 17A, 17B of the bus bars 15 are separated collectively.

Thus, in the present invention, as the parallel sets of bus bars 14, 15 are linked with the carriers 16A and 16B and the carriers 17A, 17B, respectively, until the resistance welding is completed, the manufacturing operation is extremely simple.

Figure 6A:
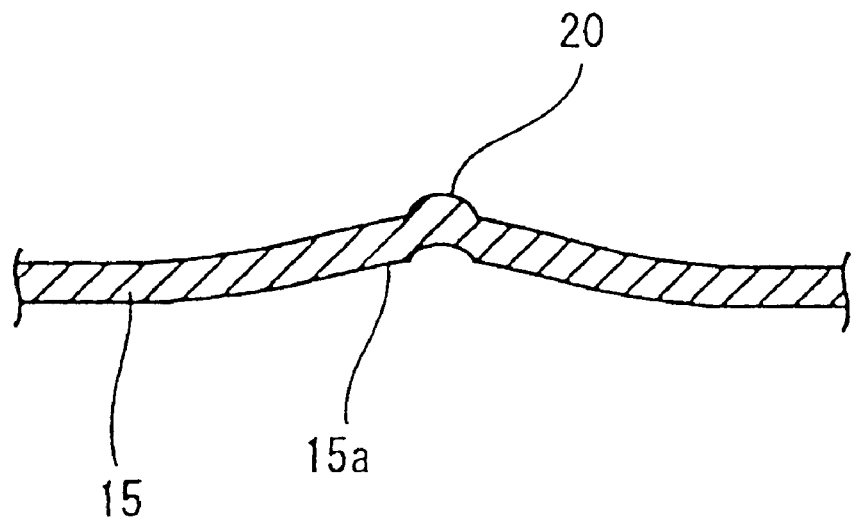
FIGS. 6(A) and (B) are sectional views showing modified examples of the circuit board of FIG. 1(A)
Figure 6B:
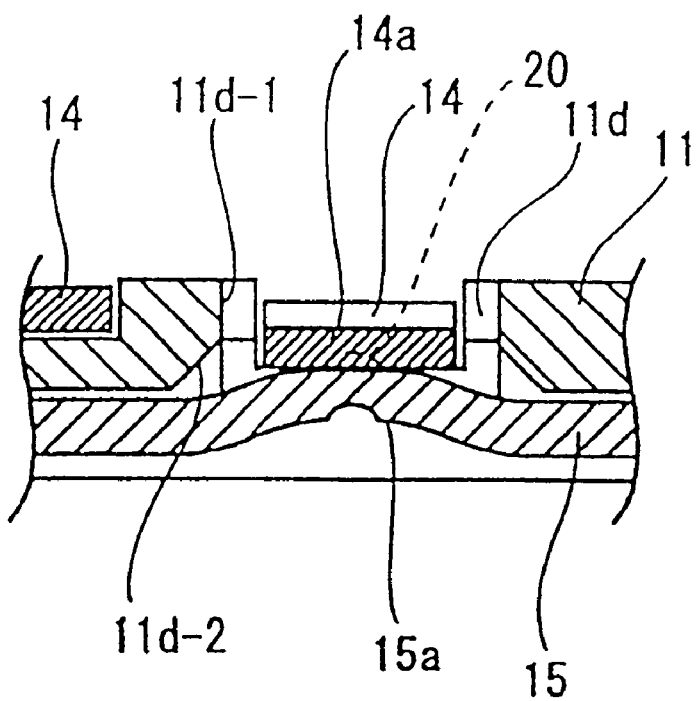
Figure 7A:
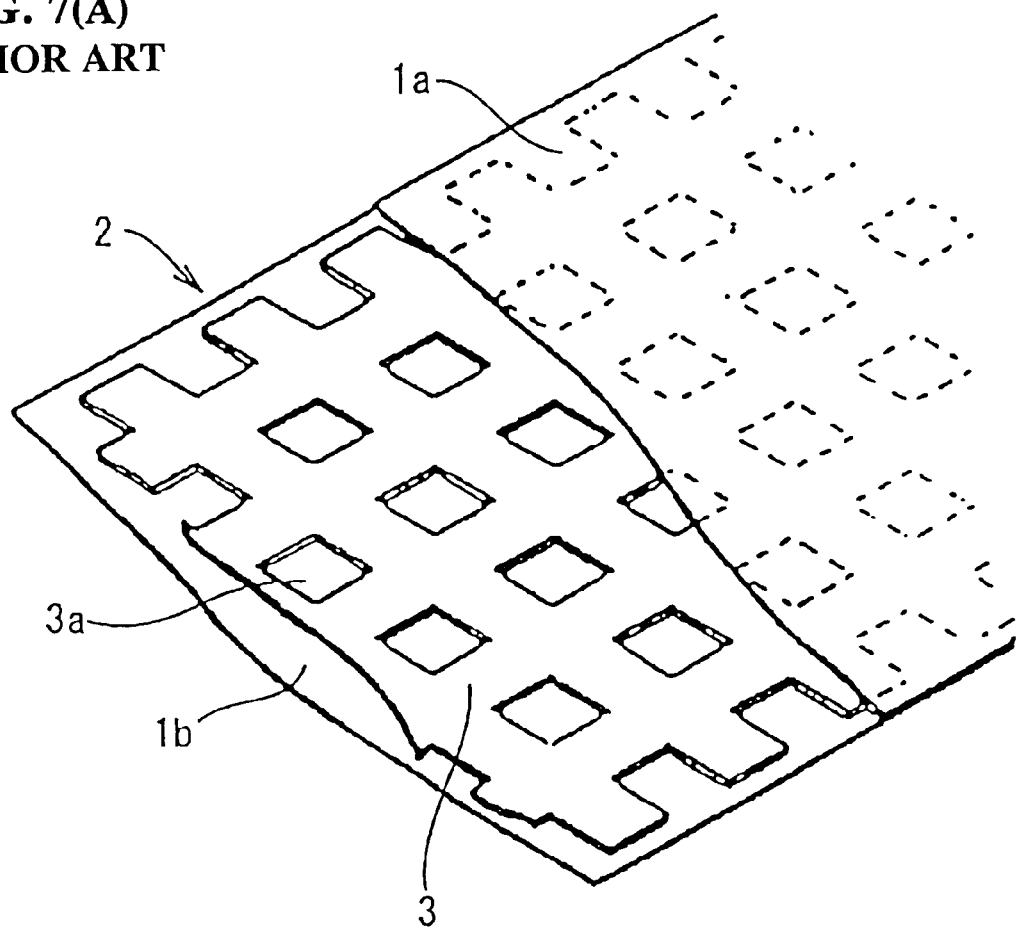
FIGS. 7(A) and (B) show a prior art example discussed above.
Figure 7B:
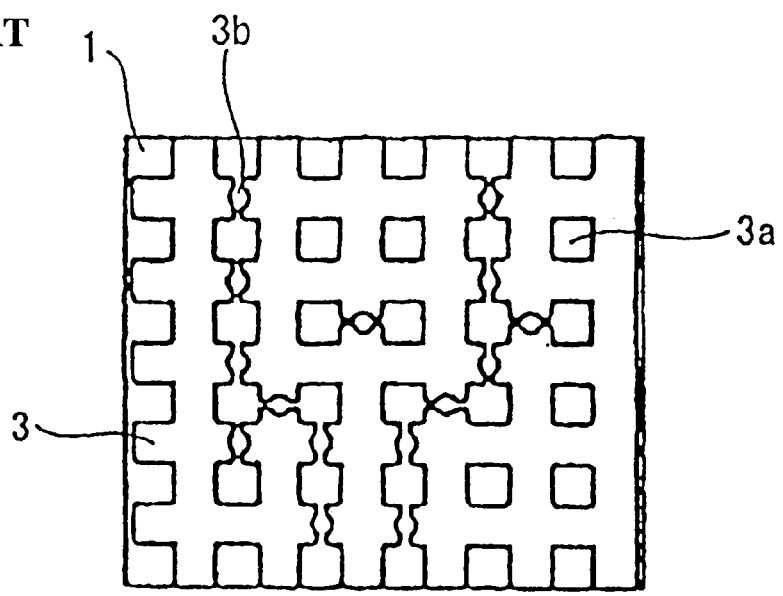

In a variation of this embodiment shown in FIG. 6, fine protrusions 20 of, for example, 0.3 mm height are provided on the upper faces of the bent parts 15a of the bus bars 15 in the press working. Further, when the fine protrusions 20 are provided, the bent part 15a including the fine protrusion 20 is also formed by length extension so that that the thickness of the bus bar is reduced by, for example, 15 to 25%, and the dimension between the two ends of each bus bar 15 is the same as that before the formation of the bent part.

When the fine protrusions 20 are provided on the contact face as described above, the welding zone can be concentrated at a small area in resistance welding, so that heat generation occurs easily, and the welding quality can be raised.

The circuit board 10 formed as described above is for example accommodated in the lower casing part of an electrical connection box and assembled by placing an upper casing part thereon. The casing is typically of molded plastics material and has lateral openings to receive components which have terminals to engage the ends of the bus bars 14, 15 e.g. connectors, fuses and relays. Further, a plurality of the circuit boards 10 may be arranged in a stack in a box by lamination through a further insulation board or boards.

As the above embodiment illustrates, according to the present invention, for an interior circuit of an electrical connection box, the arrays of strip bus bars are arranged to give a lattice shape on the upper and lower faces of an insulation board. Penetration holes are provided on the insulation board at intersection points where conduction is required, and bent parts provided on the upper and lower bus bars are mutually joined through the penetration holes. The bus bars 14, 15 are in the form of parallel spaced discrete metal strips. They are preferably joined without use of bonding material, e.g. by resistance-welding. Thereby, the connection of the upper and lower bus bars can be securely and easily obtained, and variation of the circuits is simple to achieve. Further, the bent parts are formed by reducing the bus bar thickness by, for example, 15 to 25%, such that the dimension between the ends of the bus bars is the same before and after the formation of bent parts. Therefore, the parallel bus bars can be processed when they are joined with the carriers. Accordingly, their installation on the insulation board is easy and the resistance welding can be carried out in a condition in which the positioning of the bus bars was accurately carried out. As a result, the quality of the resistance welding can be high.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. A circuit board, having:
   an insulation board having first and second opposite main faces;
   a plurality of first strip bus bars of substantially a same length, at least one first strip bus bar having a first preformed bent portion, arranged on said first main face and extending in parallel in a first direction; and
   a plurality of second strip bus bars of substantially a same length, at least one second strip bus bar having a second preformed bent portion, arranged on said second main face and extending in parallel in a second direction crossing said first direction, whereby as seen in plan view on one of said main faces there is an array of crossing points of said bus bars;
   wherein a pitch spacing between one of the plurality of first strip bus bars and the plurality of second strip bus bars is variable whereas the pitch spacing between the other of the plurality of first strip bus bars land the plurality of second strip bus bars is uniform, and said insulation board has at least one hole through it at at least one of said crossing points, and at least one of said at least one hole the first and second preformed bent portions of said at least one first strip bus bar and said at least one second strip bus bar are bent each towards the other and are mutually joined to establish electrical connection between them, whereby a predetermined wiring pattern is obtained.

2. A circuit board according to claim 1, wherein at the at least one hole said strip bus bars are joined by welding.

3. A circuit board according to claim 1, wherein at the at least one hole said strip bus bars are joined by resistance welding.

4. A circuit board according to claim 1, wherein said first strip bus bars are located in grooves in said first main face of said insulation board and said second strip bus bars are located in grooves in said second main face of said insulation board.

5. A circuit board according to claim 1, wherein the positioning of the first and second strip bus bars is maintained, prior to joining each respective strip bus bar to another for establishing the electrical connection, by carrier members in which ends of the respective first and second strip bus bars are situated.

6. A circuit board according to claim 1, wherein at the at least one hole, a thickness of each of said mutually crossing strip bus bars in a direction of thickness of said insulation board is reduced, compared with a thickness of adjacent portions of said strip bus bars, by 15 to 25% of said thickness of said adjacent portions.

7. A circuit board according to claim 1, wherein said strip bus bars have a nominal thickness in the range of 0.5 to 1.0 mm.

8. An electrical connection box containing a circuit board according to claim 1.

9. A method of making a circuit board, comprising the steps of:
   (i) providing an insulation board having first and second opposite main faces and at least one holes through it at locations at which electrical connection is to be made through the board by joining a first strip bus bar to a second bus bar;

(ii) locating a plurality of first strip bus bars of substantially a same length on said first main face, the first strip bus bars extending in parallel in a first direction, at least one first strip bus bar having a first preformed bent portion;

(iii) locating a plurality of second strip bus bars of substantially a same length on said second main face, the second strip bus bars extending in parallel in a second direction crossing said first direction, at least one second strip bus bar having a second preformed bent portion, whereby as seen in plan view on one of said main faces there is an array of crossing points of said first and second strip bus bars, at least one of said crossing points coinciding with one of the at least one hole;

(iv) providing both of a mutually crossing pair of said first and second strip bus bars, at a position of at least one of the at least one hole, with the first and second preformed bent portions bent towards the other strip bus bar, respectively, of said pair; and (v) joining each said mutually crossing pair of first and second strip bus bars at at least one of the at least one hole to establish electrical connection between them, wherein a pitch spacing between one of the plurality of first strip bus bars and the plurality of second strip bus bars is variable whereas the pitch spacing between the other of the plurality of first strip bus bars and the plurality of second strip bus bars is uniform.

10. A method according to claim 9, wherein said joining step (v) is carried out by welding.

11. A method according to claim 9, wherein said joining step (v) is carried out by resistance welding.

12. A method according to claim 9, wherein said step (iv) is performed before locating said strip bus bars on said insulation board.

13. A method according to claim 9, comprising in said step (iv) reducing a thickness of each said first and second strip bus bar of said mutually crossing pair at its said preformed bent portion, in a thickness direction of the insulation board, by 15 to 25% of a nominal thickness of the respective strip bus bar at adjacent portions of unreduced thickness.

14. A method according to claim 13, wherein during step (iv), at least one of said first strip bus bars and said second strip bus bars are joined at opposite ends thereof to a pair of carrier members and are joint to establish the electrical connection, after which the carrier members are removed.

15. A method according to claim 9, wherein, during step (iv), at least one of said first strip bus bars and said second strip bus bars are joined at opposite ends thereof to a pair of carrier members which maintain their relative positions.

16. A method according to claim 9, wherein, prior to said joining step (v), one of said bent preformed portions has a protrusion towards the other of said mutually crossing pair of strip bus bars.

17. The circuit board of claim 1, wherein the first and second bus bars further comprise male terminal ends for joining with corresponding female terminals provided on a component.

18. The method of claim 9, further comprising providing the first and second bus bars with male terminal ends and joining each male terminal end with a corresponding female terminal provided on a component.

* * * * *